(12) United States Patent
Adkisson et al.

(10) Patent No.: US 7,217,969 B2
(45) Date of Patent: May 15, 2007

(54) FLIP FERAM CELL AND METHOD TO FORM SAME

(75) Inventors: James William Adkisson, Jericho, VT (US); Charles Thomas Black, White Plains, NY (US); Alfred Grill, White Plains, NY (US); Randy William Mann, Jericho, VT (US); Deborah Ann Neumayer, Danbury, CT (US); Wilbur David Pricer, Charlotte, VT (US); Katherine Lynn Saenger, Ossining, NY (US); Thomas McCarroll Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 10/384,002

(22) Filed: Mar. 7, 2003

(65) Prior Publication Data
US 2003/0155598 A1 Aug. 21, 2003

Related U.S. Application Data

(62) Division of application No. 09/924,660, filed on Aug. 8, 2001, now Pat. No. 6,555,859, which is a division of application No. 09/383,744, filed on Aug. 26, 1999, now Pat. No. 6,333,202.

(51) Int. Cl.
*H01L 29/76* (2006.01)
(52) U.S. Cl. .................... 257/295; 257/296; 257/310; 257/E27.104; 257/E21.663
(58) Field of Classification Search ............ 257/295, 257/296, 310, 27.104, 21.663; 438/3, 240, 438/458, 459, 520
See application file for complete search history.

(56) References Cited

U.S. PATENT DOCUMENTS

| | | | |
|---|---|---|---|
| 5,060,191 A | 10/1991 | Nagasaki et al. |
| 5,119,329 A | 6/1992 | Evans, Jr. et al. |
| 5,216,572 A | 6/1993 | Larson et al. |
| 5,330,931 A | 7/1994 | Emesh et al. |
| 5,466,629 A | 11/1995 | Mihara et al. |
| 5,519,566 A | 5/1996 | Perino et al. |
| 5,535,154 A | 7/1996 | Kiyono |
| 5,563,762 A | 10/1996 | Leung et al. |
| 5,580,814 A | 12/1996 | Larson |

(Continued)

OTHER PUBLICATIONS

Abstract RD 405035 A.

*Primary Examiner*—Michelle Estrada
(74) *Attorney, Agent, or Firm*—Scully, Scott, Murphy & Presser, P.C.; William D. Sabo, Esq.

(57) ABSTRACT

A method of forming an integrated ferroelectric/CMOS structure which effectively separates incompatible high temperature deposition and annealing processes is provided. The method of the present invention includes separately forming a CMOS structure and a ferroelectric delivery wafer. These separate structures are then brought into contact with each and the ferroelectric film of the delivery wafer is bonded to the upper conductive electrode layer of the CMOS structure by using a low temperature anneal step. A portion of the delivery wafer is then removed providing an integrated FE/CMOS structure wherein the ferroelectric capacitor is formed on top of the CMOS structure. The capacitor is in contact with the transistor of the CMOS structure through all the wiring levels of the CMOS structure.

2 Claims, 8 Drawing Sheets

U.S. PATENT DOCUMENTS

| | | |
|---|---|---|
| 5,593,914 A | 1/1997 | Evans, Jr. et al. |
| 5,644,838 A * | 7/1997 | Beratan ..................... 29/840 |
| 5,716,875 A | 2/1998 | Jones, Jr. et al. |
| 5,719,416 A | 2/1998 | Yoshimori et al. |
| 5,804,850 A | 9/1998 | Evans, Jr. et al. |
| 5,838,035 A | 11/1998 | Ramesh |
| 6,051,858 A * | 4/2000 | Uchida et al. ............. 257/295 |
| 6,180,447 B1 * | 1/2001 | Park et al. .................. 438/240 |
| 6,198,652 B1 * | 3/2001 | Kawakubo et al. ......... 365/145 |
| 6,242,298 B1 * | 6/2001 | Kawakubo .................. 438/239 |
| 6,307,228 B1 | 10/2001 | Miyazawa |
| 6,322,849 B2 | 11/2001 | Joshi et al. |
| 6,388,285 B1 * | 5/2002 | Black et al. ................. 257/315 |

\* cited by examiner

FLIP FERAM CELL AND METHOD TO FORM SAME

This application is a divisional of U.S. application Ser. No. 09/924,660 filed on Aug. 8, 2001 now U.S. Pat. No. 6,555,859, which is a divisional of U.S. Ser. No. 09/383,744 filed on Aug. 26, 1999, now U.S. Pat. No. 6,333,202.

FIELD OF THE INVENTION

The present invention relates to a ferroelectric random access memory (FERAM) cell, and in particular to a method of fabricating a ferroelectric (FE) capacitor on a complementary metal oxide semiconductor (CMOS) structure wherein exposure of the integrated structure to high temperature steps of FE deposition and processing is eliminated. The present invention also relates to a FERAM cell design and to a method to bond a FE capacitor to the CMOS structure after fabrication of both structures is complete, thereby avoiding the incompatibilities between the two processes. The resulting structure can be used as a non-volatile RAM (NVRAM) or a dynamic random access memory (DRAM), if the FE material is replaced with a material of high-dielectric-constant.

BACKGROUND OF THE INVENTION

The integration of high value capacitors in integrated circuits (ICs) is limited by the fact that conventional high value capacitors take up large areas of the IC chip, thus reducing device packing density and layout efficiency. Many applications require a large number of capacitors. Often the capacitors must be incorporated as discrete off-chip components, substantially increasing the bulk of the peripheral circuitry. In view of the increasing demand for compact lightweight electronic equipment, it is desirable that the number of discrete components be reduced.

The minimum dimensions of IC capacitors are determined primarily by the relatively low dielectric constant (0<10) of conventional capacitor dielectrics, e.g. $SiO_2$ and $Si_3N_4$. Thus, as device dimensions decrease, there is increasing interest in other dielectrics having higher dielectric constants than conventional dielectric materials.

Ferroelectric (FE) and high-epsilon (HE) dielectrics (0=20 or greater) have found application in random access memory (RAM) cells since they provide for the formation of NVRAMs and DRAMs. Moreover, when used as NVRAM, ferroelectric dielectrics advantageously provide low voltage programmability, fast access times and low power consumption.

FE materials pose several integration problems. In particular, most ferroelectric materials require high temperature post-deposition oxygen anneals (600° C. or above) to achieve properties desirable for storage media. However, such high anneal temperatures can be incompatible with the CMOS devices already fabricated on the wafer. Furthermore, any subsequent forming gas or hydrogen anneals (highly desirable for CMOS devices) degrade the ferroelectric material, thus requiring additional high temperature oxygen anneals late in the processing sequence which in turn are detrimental to the CMOS circuitry.

In view of the above drawbacks with prior art methods of integrating ferroelectric capacitors with CMOS structures, there is a continued need for developing a new and improved method which is capable of providing an integrated FE capacitor/CMOS structure without subjecting the CMOS structure to high temperature steps that are typically required in the prior art for ferroelectric processing.

SUMMARY OF THE INVENTION

The present invention provides a method of integrating a FE capacitor with a CMOS structure which allows the CMOS structure to avoid potentially-detrimental high-temperature steps needed for FE deposition and processing. The invention likewise provides a method of integrating a plurality of FE capacitors with a plurality of CMOS structures. Specifically, the method of the present invention comprises the steps of:

(a) forming a CMOS structure in electrical contact with a conductive electrode layer on its exposed top surface;

(b) separately providing a ferroelectric delivery wafer, said ferroelectric delivery wafer comprising a sacrificial release layer formed on a delivery substrate, a conductive layer formed on said sacrificial release layer and a ferroelectric film formed on said conductive layer, said ferroelectric film having an exposed outer surface;

(c) placing said exposed outer surface of said ferroelectric film on the CMOS structure of step (a), wherein said ferroelectric film is in contact with said conductive electrode layer;

(d) bonding, at a temperature of less than about 600EC, the outer surface of said ferroelectric film to said CMOS structure; and (e) separating the sacrificial release layer from the bonded structure.

It is noted that the conductive electrode layer of the CMOS structure of step (a) may be patterned or unpatterned. Likewise, the conductive layer of the delivery wafer may also be patterned or unpatterned.

If not previously patterned, one or more of the conductive layers in the integrated FE capacitor/CMOS structure may optionally be patterned. This optional patterning step occurs after step (e) above.

Another embodiment of the present method is to apply a surface treatment to the conductive electrode layer of the CMOS structure prior to conducting step (c). In yet another embodiment of the present invention, the method also includes a step of forming a passivating layer over the structure provided in step (e). In still a further embodiment of the present invention, the delivery wafer may include a second conductive layer on top of the ferroelectric film. In this embodiment of the invention, the second conductive layer may be patterned or unpatterned. In another aspect of the present invention, a novel integrated FE/CMOS structure is provided wherein the storage capacitor is constructed over all the transistors and wiring levels (excluding possibly any pad out structures) of the CMOS structure. Specifically, the novel integrated FE/CMOS structure of the present invention comprises:

a CMOS structure having at least one conductive layer and at least one transistor; and a ferroelectric storage capacitor formed on said CMOS structure, said ferroelectric storage capacitor comprising a bottom conductive electrode, a layer of ferroelectric film and a top conductive electrode, wherein said bottom conductive electrode of said capacitor is connected to a terminal of said transistor through one or more conductive layers of said CMOS structure.

The present invention also provides a novel ferroelectric delivery wafer which allows for fabricating an integrated FERAM cell while isolating the CMOS circuitry from high temperature post-FE-deposition anneals. That is, although high temperature anneals are used in forming the separate CMOS and ferroelectric structures, and bonding thereof, no such anneals are needed thereafter. Specifically, the ferroelectric delivery wafer of the present invention comprises a carrier substrate, a sacrificial release layer formed on said carrier substrate, a conductive layer formed on said sacrificial release layer, and a ferroelectric film formed on said conductive layer. This structure is flipped onto a CMOS structure so that the ferroelectric film is in contact with a CMOS structure having an upper conductive electrode layer. After conducting steps (a) and (e) above, an integrated FE/CMOS structure in accordance with the present invention, is formed.

BRIEF DESCRIPTION OF THE DRAWINGS

In FIGS. 2(a)–(b), neither the conductive layer of the FE delivery wafer nor the conductive layer of the CMOS structure is patterned prior to bonding. In FIGS. 2(c)–(d), only the conductive layer of the FE delivery wafer is patterned. In FIGS. 2(e)–(f), the conductive layers of both the FE and CMOS structures are patterned.

DETAILED DESCRIPTION OF THE INVENTION

Figure 1A:
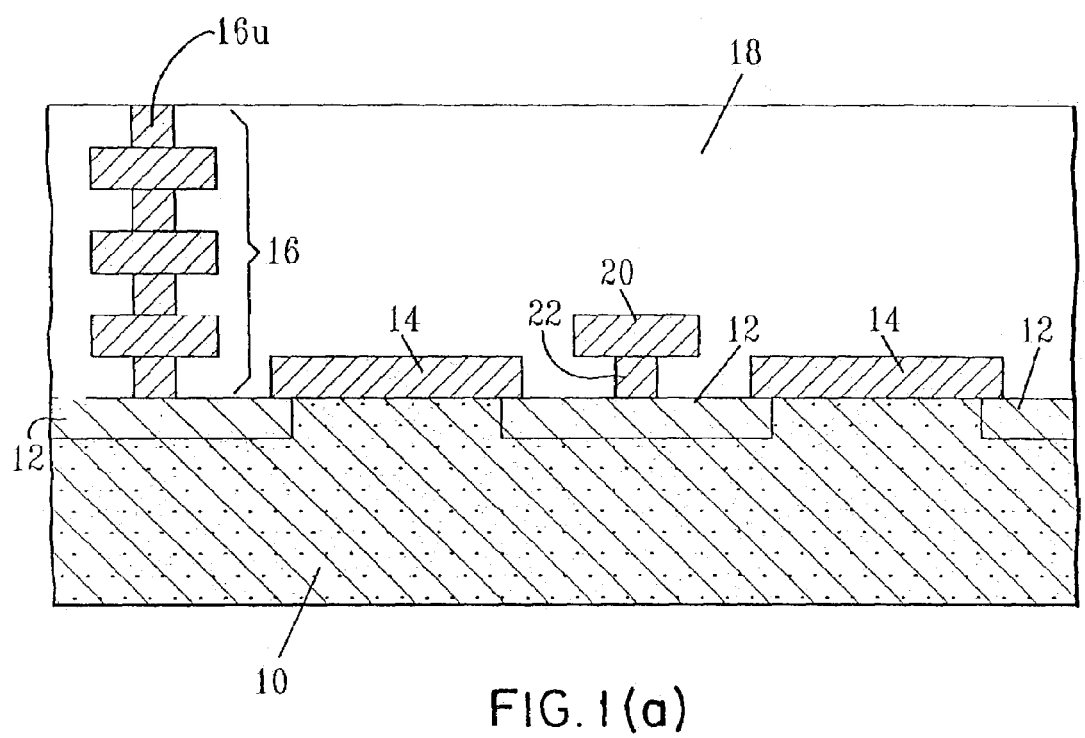
FIGS. 1(a)–(e) are cross-sectional views illustrating the various processing steps that may be employed in one embodiment of the present invention. In this embodiment, the conductive layer of the ferroelectric delivery wafer is not patterned, whereas the conductive electrode layer of the CMOS structure is patterned.

The present invention will now be described in more detail by referring to the drawings that accompany the present application. It should be noted that in the accompanying drawings like reference numerals are used for describing like and corresponding elements.

Reference is first made to FIG. 1(a) which shows one possible CMOS structure that can be employed in the present invention. In this figure, the conductive electrode layer is patterned. In addition to a patterned conductive electrode layer in the CMOS structure, the present invention also contemplates a non-patterned conductive electrode layer such as those shown in FIGS. 2(a), (c), and 2(g). Although description is made to the structure shown in FIG. 1(a), it is noted herein that other CMOS structures containing at least one transistor and at least one conductive layer can be employed in the present invention.

Figure 2A:
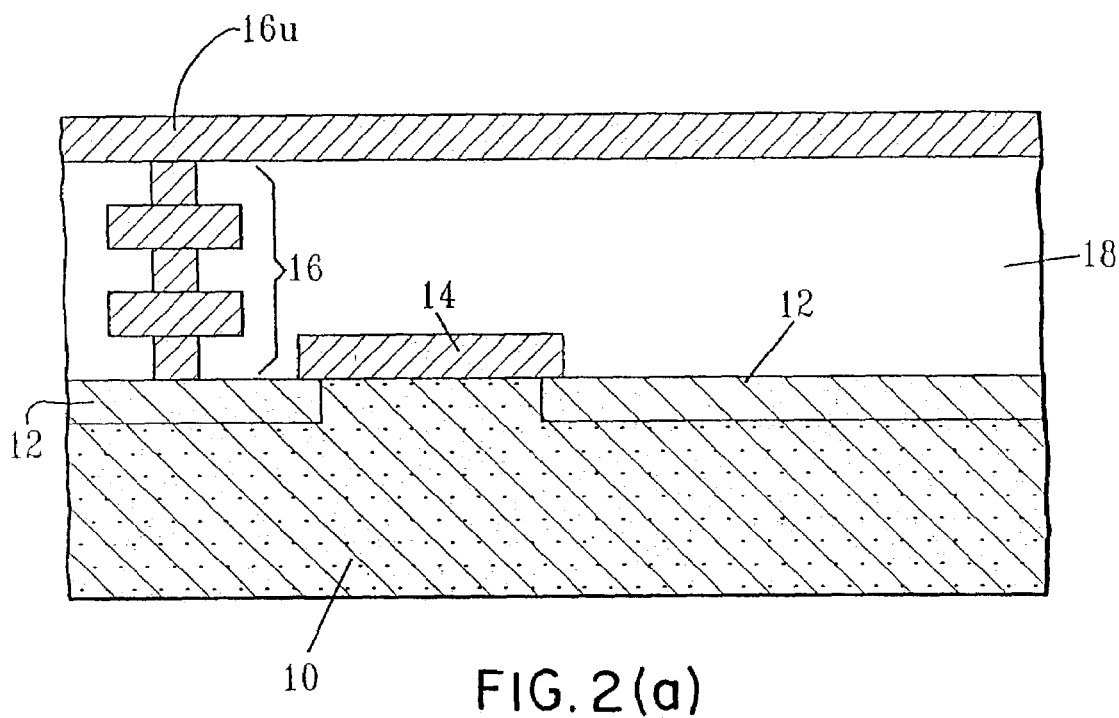
FIGS. 2(a)–(e) are cross-sectional views illustrating different embodiments of the present invention.
Figure 2B:
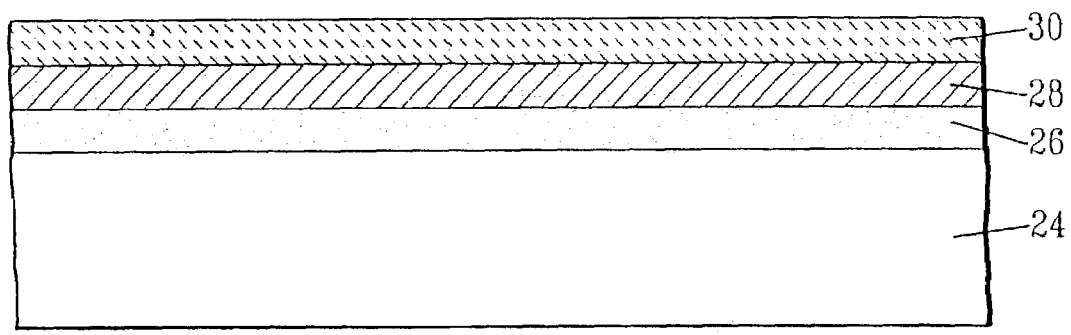
Figure 2C:
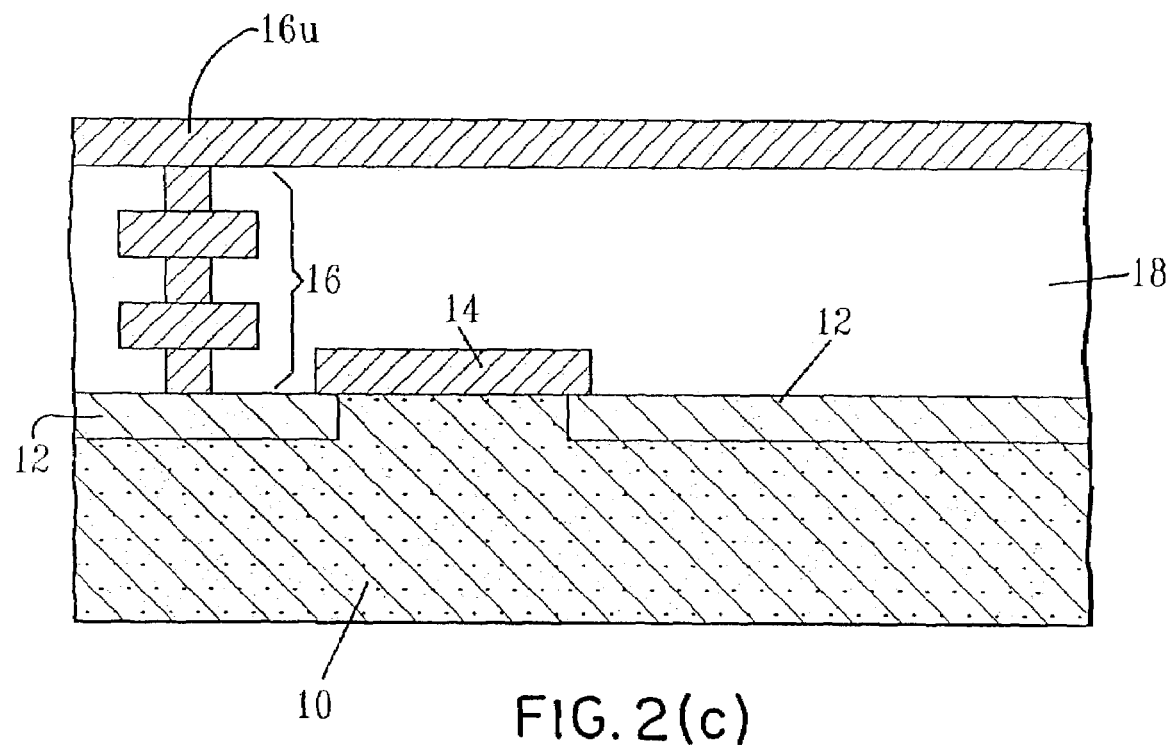
Figure 2D:
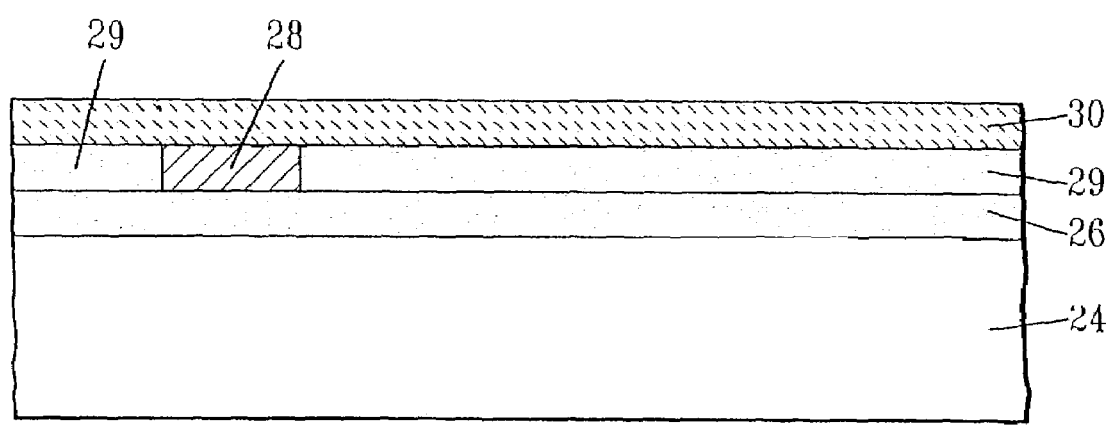
Figure 2E:
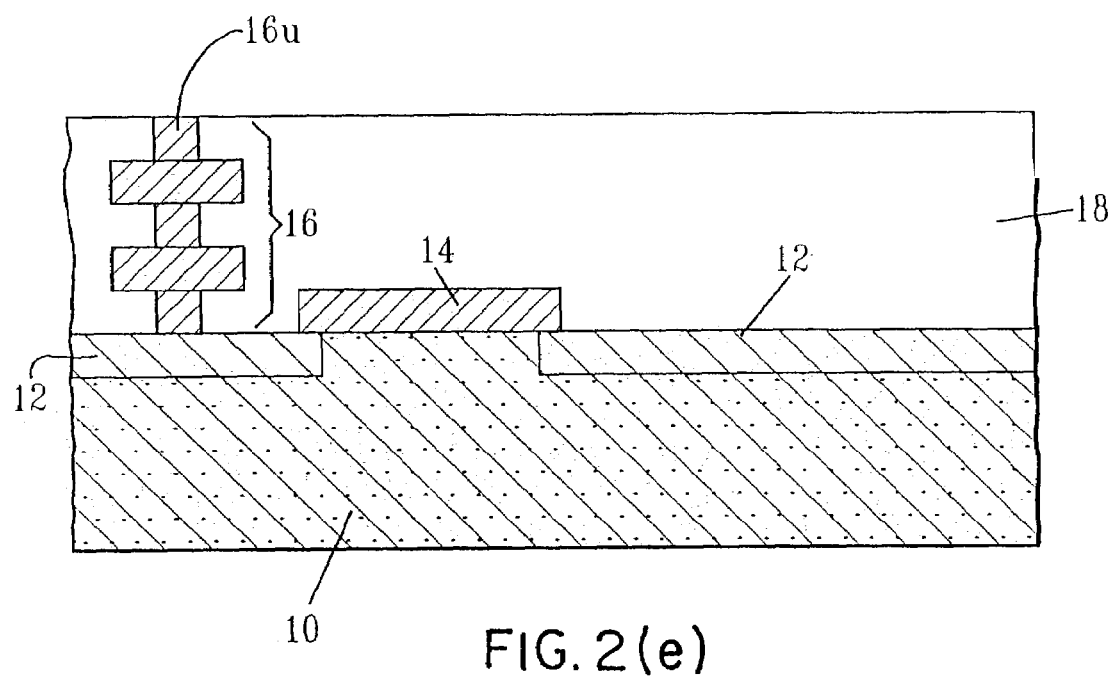
Figure 2F:
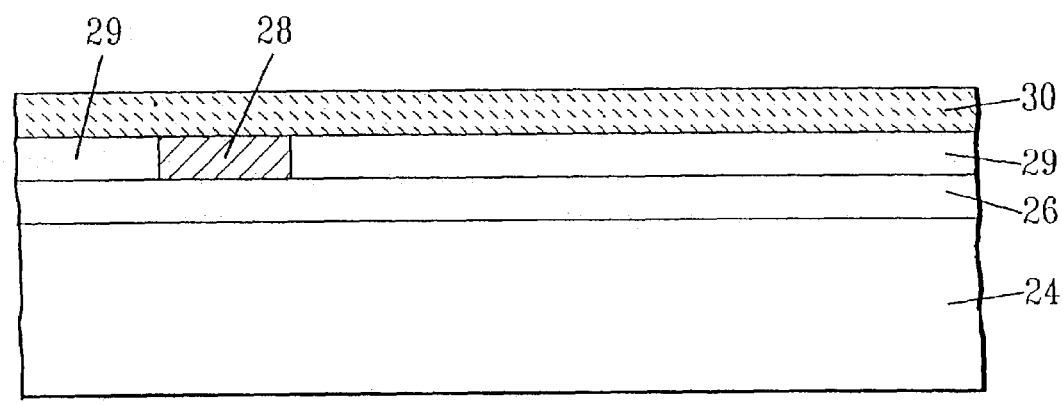
Figure 2G:
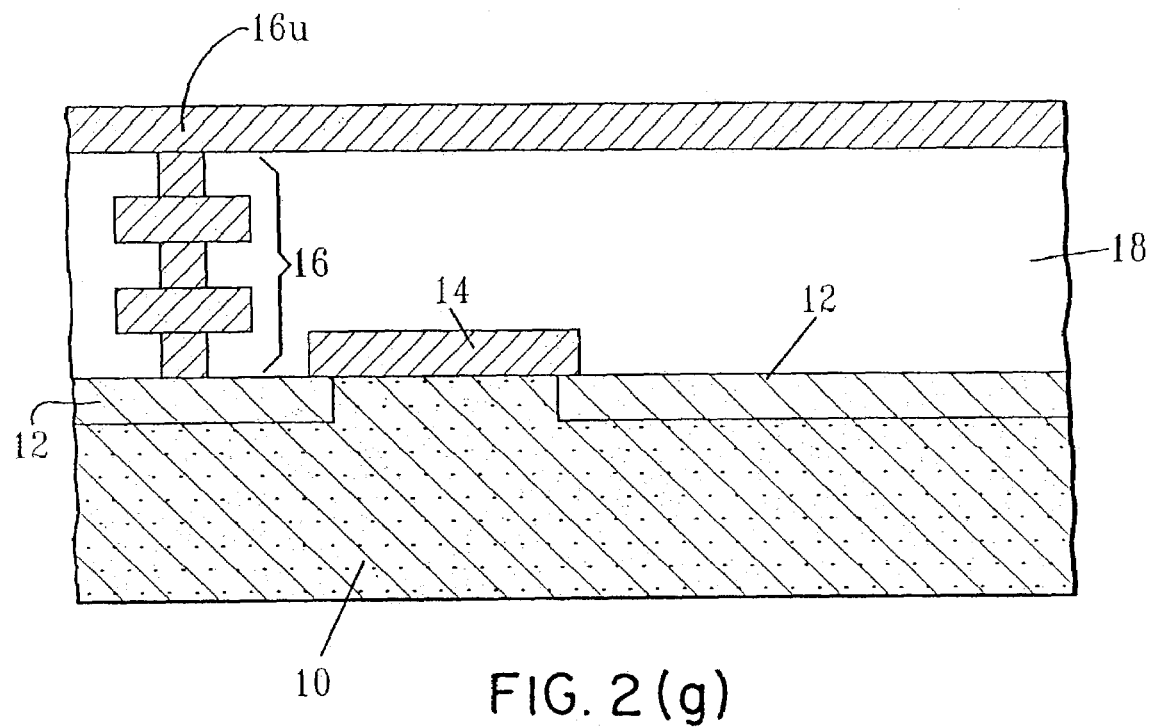
In FIGS. 2(g)–(h) and FIGS. 2(i)–(j), an unpatterned FE delivery wafer containing an additional conductive layer is bonded to an unpatterned and patterned CMOS wafer.

Specifically, the CMOS structure shown in FIG. 1(a) comprises a semiconductor substrate 10 having diffusion regions, i.e. diffused portions of the bitlines, 12 formed in the surface thereof. On top of the semiconductor substrate there are shown transistor regions 14 which are in contact with the diffusion regions 12. The CMOS structure shown in FIG. 1(a) further comprises multiple wiring levels (or conductive layers) 16 which are formed in dielectric layer 18. The upper wiring level (or conductive layer) 16u is composed of a patterned conductive electrode layer and it forms the bottom electrode of the integrated FE/CMOS structure of the present invention. Between the transistor regions, there is shown bitline 20 and bitline contact 22. It is emphasized that even though the figure depicts a patterned conductive electrode layer as 16u, the present invention also contemplates the use of a non-patterned conductive electrode layer 16u, as shown in FIGS. 2(a), 2(c) and 2(g).

The structure shown in FIG. 1(a) is composed of materials well known to those skilled in the art and it is fabricated using conventional processes well known to those skilled in the art. For example, semiconductor substrate 10 is composed of any semiconducting material including, but not limited to: Si, Ge, SiGe, GaAs, InAs, InP, all other III/V compounds and organic semiconductors. The semiconductor substrate may be doped or undoped. The diffusion regions may contain p or n type dopants.

The transistor region is comprised of a conventional gate stack which includes a layer of gate insulator such as $SiO_2$ formed on the surface of the semiconductor substrate and a layer of polysilicon or other gate conductor formed on the gate insulator. A salicide layer may be formed on top of the polysilicon or gate conductor. Transistor region 14 may be separated by sidewall isolation regions as well as other conventional components well known to those skilled in the art. For simplicity, the various elements of the transistor are not shown in the drawings, but are nevertheless intended to be included in region 14.

Wiring levels 16 comprise vias and lines which contain conventional conductive materials such as metals, noble-metals, conductive nitrides, noble metal oxides, conductive oxides and mixtures or multilayers thereof. Exemplary conductive materials include: Cu, W, Al, Pt, polysilicon, TiN, Ta, TaN, Ti and $WSi_x$. The various wiring levels may be composed of the same or different conductive material. In FIG. 1(a), all the wiring levels (lines and vias) are depicted as being composed of the same conductive materials.

Dielectric layer 18 is composed of any inorganic or organic dielectric material known to the art including, but not limited to: $SiO_2$, $Si_3N_4$, SiCOH, diamond-like carbon, paralyene polymers, polyimides, silicon-containing polymers, organic polymers, hybrid organo-silicon polymers (HOSP) and other suitable dielectric materials. Dielectric layer 18 may be composed of layers of the same material, shown in FIG. 1(a), or layers of different dielectric materials (not shown). When layers of different dielectric materials are used, a barrier layer, not shown in the drawings, may be formed between each successive wiring level. The optional barrier layer is composed of conventional materials including, but not limited to: $SiO_2$, $Al_2O_3$, $TiO_2$, $Si_3N_4$, $SiO_xN_4$ and $Ta_2O_5$.

As stated above, the structure shown in FIG. 1(a) is fabricated using conventional processing steps which are well known to those skilled in the art including: semiconductor device fabrication and back end of the line (BEOL) processing. For example, the CMOS device shown in FIG. 1(a) can be fabricated by forming the transistor region on the surface of the semiconductor substrate, i.e. growing a gate insulator, depositing a gate conductor on said gate insulator and thereafter patterning those layers to provide the transistor region. The diffusion regions can then be formed using conventional ion implantation and annealing.

Although the drawings of the present invention depict doing all BEOL wiring before bonding the wafers, it is also within the contemplation of the present invention to carry out wiring after bonding.

The wiring levels of the CMOS structure shown in FIG. 1(a) are then typically formed by: depositing a dielectric material on the surface of the semiconductor structure, opening vias in the dielectric layer, filling the vias with a conductive material, forming trenches in the dielectric layer over the vias, filling the trenches with a conductive material, and planarizing the structure using conventional planarization techniques such as chemical-mechanical polishing or grinding. It is noted that in this figure, the last, i.e. upper, wiring level $16u$ is a patterned conductive electrode comprising a conductive electrode material. The conductive electrode layer $16u$ is the bottom electrode of the integrated FE/CMOS structure of the present invention.

Suitable conductive electrode materials that can be used in the present invention as the upper conductive layer of the CMOS structure include, but are not limited to: noble metals such as Pt, Pd, Ir, Rh, Os, Au, Ag, and Ru; noble metal oxides such as $PtO_x$, $IrO_x$, $PdO_x$, $RhO_x$, $OsO_x$, $AuO_x$, $AgO_x$ and $RuO_x$; conducting oxides such as $SrRuO_3$, $LaSrCoO_3$, $YBa_2Cu_3O_7$; non-noble metals; conducting silicides; doped polycrystalline silicon; mixtures and multilayers thereof. The noble metals and/or oxides may be crystalline or in an amorphous form. As stated above, the upper conductive electrode layer of the CMOS structure may be patterned using conventional lithography and RIE or unpatterned.

The upper conductive layer of the CMOS structure may further include an additional layer of a consumable material which can subsequently react with one or more layers of the ferroelectric delivery wafer during bonding. This consumable layer may be conductive, semiconducting, or insulating, and patterned before or after said step of bonding. The consumable layer is preferably formed from a material such as doped or undoped polycrystalline silicon which may react with a metal layer to form a conductive metal silicide.

It is noted that bitline and bitline contacts, 20 and 22 respectively, are composed of conductive materials and may be fabricated in the same manner as the various wiring levels.

After forming the conductive electrode layer $16u$, which may include planarization, the structure may optionally be subjected to an appropriate surface treatment step. Suitable surface treatments that may optionally be employed in the present invention include: oxidation by plasma ashing, thermal oxidation, surface chemical treatments and application of a thin metal oxide layer by chemical solution deposition (CSD), chemical vapor deposition (CVD) or physical vapor deposition (PVD).

When oxidation by plasma ashing is performed, it may be carried out using high density plasma, microwave plasma, RF plasma ion beam bombardment produced by an oxygen-containing ion beams, or combination thereof, with or without separately controllable biasing. Typically, when employed, plasma ashing is conducted in a reaction chamber having an oxygen pressure between about 0.01 to about 2000 mTorr, a radio frequency power of at least 50 W and an exposure time of at least 1 second.

When thermal oxidation is employed as the surface treatment means, the oxidation is typically carried out a temperature of less than about 600EC. The thermal oxidation may include: HCl, $H_2O$ or $H_2O_2$ to enhance hydroxyl formation. Suitable oxidizing gases include: $O_2$, $N_2O$, $O_3$ or combination thereof.

When surface chemical treatments are employed as the optional surface treatment means, acids such as $HNO_3$, $H_2SO_4$ and aqua regia; bases; and peroxide washes may be employed.

Figure 1B:
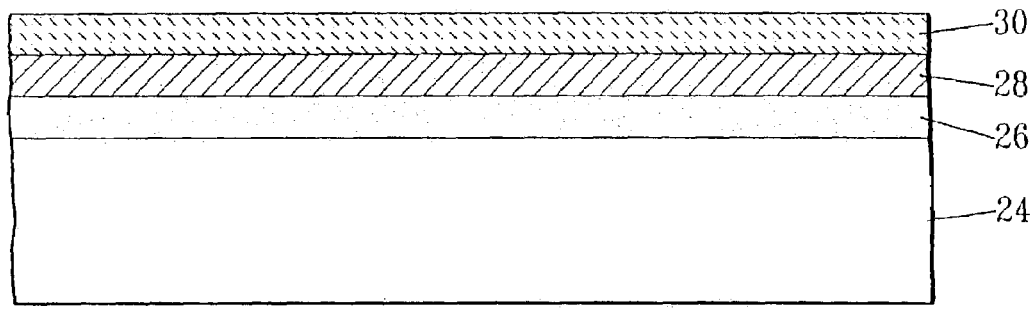
Figure 2H:
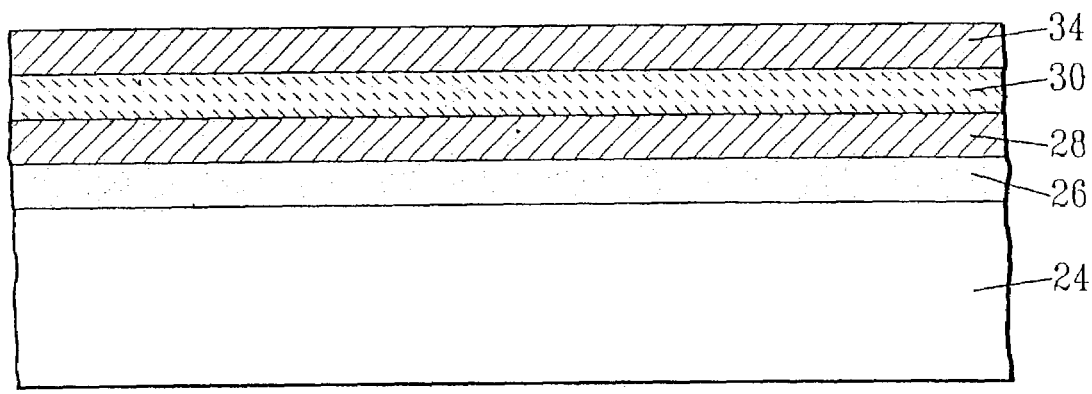
Figure 2I:
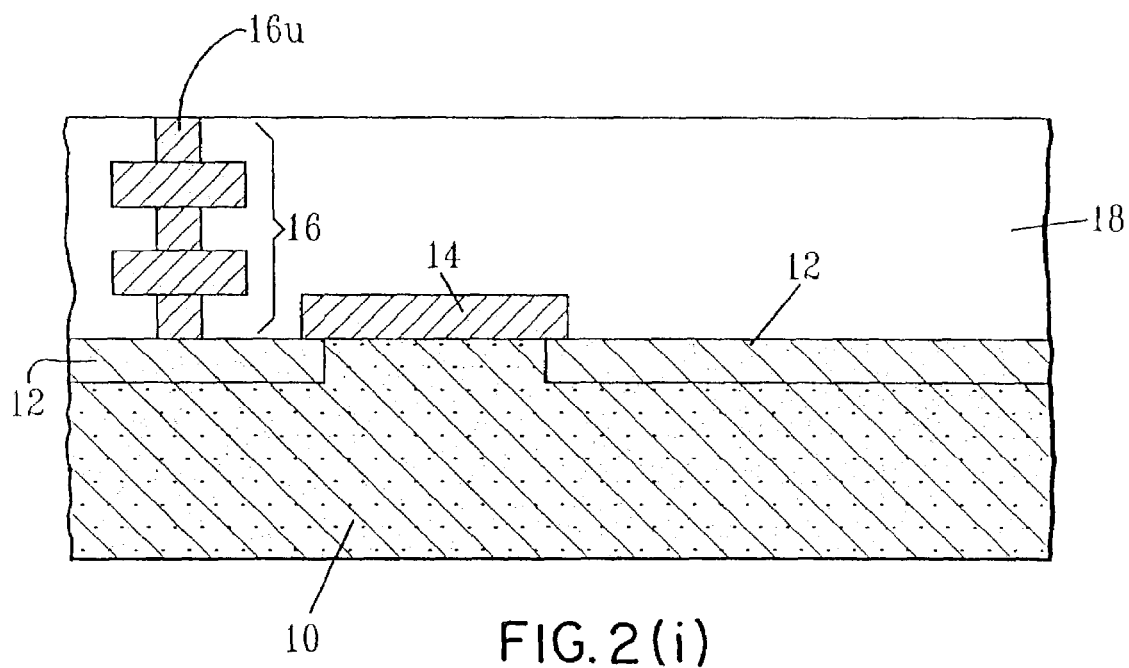
Figure 2J:
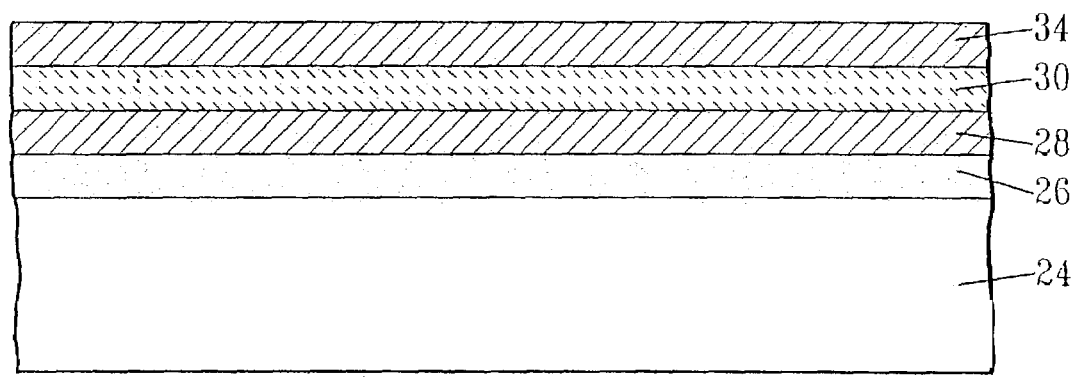

In accordance with the present invention, a ferroelectric delivery wafer is prepared separately from the CMOS structure shown in FIG. 1(a). One possible ferroelectric delivery wafer of the present invention is shown in FIG. 1(b). Specifically, the delivery wafer comprises a carrier substrate 24, a sacrificial release layer 26 formed on said carrier substrate, a conductive layer 28 formed on the sacrificial release layer, and a ferroelectric film 30 formed on the conductive layer. The conductive layer 28 may be patterned as shown in 2(d) and 2(f) or non-patterned as shown in FIGS. 1(b), 2(b), 2(h) and 2(j). If patterned, conductive layer 28 of FIG. 2(f) is preferably embedded in dielectric layer 29 to insure planarity of the ferroelectric delivery wafer. In another embodiment of the present invention, an optional second conductive layer 34 is formed on the, ferroelectric film as shown in FIGS. 2(h) and 2(j).

A suitable anneal may be performed at this time to achieve desired ferroelectric properties. Typically, such an anneal is carried out at a temperature of about 600° C. or above.

Carrier substrate 24 may be composed of one of the semiconducting materials described for semiconductor substrate 10 or it may be composed of a dielectric material like the kind mentioned above for dielectric layer 18. The carrier substrate could also be a material with its thermal-expansion coefficient well-matched to Si. Some ceramics exhibit this property. Likewise, conductive layer 28, which forms the top electrode of the capacitor of the present invention, and the optional second conductive layer 34 comprise one or more of the previously mentioned metals, noble metals, conductive nitrides, noble metal oxides, conductive oxides, conducting silicides, doped polycrystalline silicon, mixtures and multilayers thereof, which are used in forming conductive layers 16 in the CMOS structure.

Second conductive layer 34 of the ferroelectric delivery wafer may further include an additional layer of a consumable material which can subsequently react with one or more layers of the CMOS structure during bonding. This consumable layer may be conductive, semiconducting, or insulating, and patterned before or after said step of bonding. The consumable layer is preferably formed from a material such as doped or undoped polycrystalline silicon which may react with a metal layer to form a conductive metal silicide. While a consumable bonding layer may be present on either the ferroelectric delivery wafer or the CMOS structure prior to bonding, a preferable embodiment comprises an oxidation-resistant silicide-forming metal such as Pt or Ir as the optional second conductive material of the ferroelectric delivery wafer, and a thin (5–50 nm) consumable polycrystalline silicon layer on the CMOS structure.

Sacrificial release layer 26 may be an etch stop layer (for the situation in which the delivery wafer substrate is removed by etching). It may also be a surface layer of the delivery substrate that has been ion-implanted (before or after the ferroelectric deposition) with species such as hydrogen that become volatile upon heating. It may also be a deposited layer that is preferably thermally stable at the ferroelectric decomposition temperature, and easily selectively etched or decomposed without damage to the ferroelectric or conductive layers. Suitable deposited sacrificial release layers include, but are not limited to: $GeO_2$, W, TiN, $IrO_2$ PdO, and $WSi_2$.

Sacrificial release layer 26 may further include an optional passivation layer to protect the transferred layers against the damaging conditions of the releasing process. This optional layer would typically be transferred with the ferroelectric and electrode layers, and be used in cases where the release process entailed exposure to hydrogen or other reducing species. Optional passivation layer materials include: $Al_2O_3$, $TiO_2$, $Ta_2O_5$, $Si_3N_4$, and $SiO_2$.

The ferroelectric film that is employed as element 30 of the delivery element of the present invention is a crystalline, polycrystalline or amorphous high dielectric constant material (0=20 or above). Suitable ferroelectric materials that can be employed in the present invention include, but are not limited to: the perovskite-type oxides, layered ferroelectrics, compounds containing pyrochlore structures such as $Cd_2Nb_2O_7$, potassium dihydrogen phosphates, phosphates of rubidium, cesium or arsenic and other like ferroelectric materials. Combinations of these ferroelectric materials or multilayers are also contemplated herein. High-epsilon materials may also be employed in the present invention as the high dielectric ferroelectric material. The high dielectric material may display a spontaneous electric polarization (for NVRAM) or not (DRAM).

Of the aforementioned ferroelectric materials, it is highly preferred that the ferroelectric film of the present invention be composed of a perovskite-type oxide. The term Aperovskite-type oxide@ is used herein to denote a material which includes at least one acidic oxide containing at least one metal from Group IVB (Ti, Zr or Hf), VB (V, Nb or Ta), VIB (Cr, Mo or W), VIIB (Mn or Re), IIIA (Al, Ga or In) or IB (Cu, Ag or Au) of the Periodic Table of Elements (CAS version) and at least one additional cation having a positive formal charge of from about 1 to about 3. Such perovskite-type oxides typically have the basic formula: $ABO_3$ wherein A is one of the above mentioned cations, and B is one of the above mentioned metals which forms the acidic oxide.

Suitable perovskite-type oxides include, but are not limited to: titanate-based ferroelectrics, manganate-based materials, cuprate-based materials, tungsten bronze-type niobates, tantalates, or titanates, and bismuth layered-tantalates, niobates or titanates. Of these perovskite-type oxides, it is preferred to use strontium bismuth tantalate, strontium bismuth niobate, bismuth titanate, strontium bismuth tantalate niobate, lead zirconate titanate, lead lanthanum zirconate titanate, and compositions of these materials modified by the incorporation of dopants as the ferroelectric material.

The ferroelectric wafer structure shown in FIG. 1(b) is formed using conventional deposition processes well known to those skilled in the art. For example, layers 26 and 28 of the delivery wafer may be formed by chemical vapor deposition (CVD), plasma-assisted CVD, sputtering, reactive sputtering, pulsed-laser deposition, chemical solution deposition, physical-vapor deposition, plating and other like deposition techniques. After deposition of each layer, the structure may optionally be planarized using conventional techniques such as chemical-mechanical polishing.

The ferroelectric film is also formed using conventional deposition techniques well known to those skilled in the art including, but not limited to: chemical solution deposition (CSD), sol gel, metal-organic decomposition, spin coating, sputtering, reactive sputtering, metal-organic chemical vapor deposition, physical vapor deposition, plasma-assisted chemical vapor deposition, pulsed laser deposition, chemical vapor deposition, evaporation and like deposition techniques. A high temperature anneal may need to be performed at this time to obtain desired ferroelectric properties.

After forming the structure shown in FIG. 1(b), the ferroelectric delivery wafer is placed in proximity to the CMOS structure of FIG. 1(a) so that ferroelectric film 30 is in contact with patterned conductive electrode layer 16u and the top surface of dielectric layer 18. This intermediate structure is shown in FIG. 1(c).

In one embodiment of the present invention, the ferroelectric delivery wafer is optionally treated with one of the above mentioned surface treatments prior to bonding. In embodiments wherein a patterned conductive layer is employed in the delivery wafer, an alignment process may be necessary to ensure proper placement of the delivery wafer on the CMOS structure.

Figure 1C:
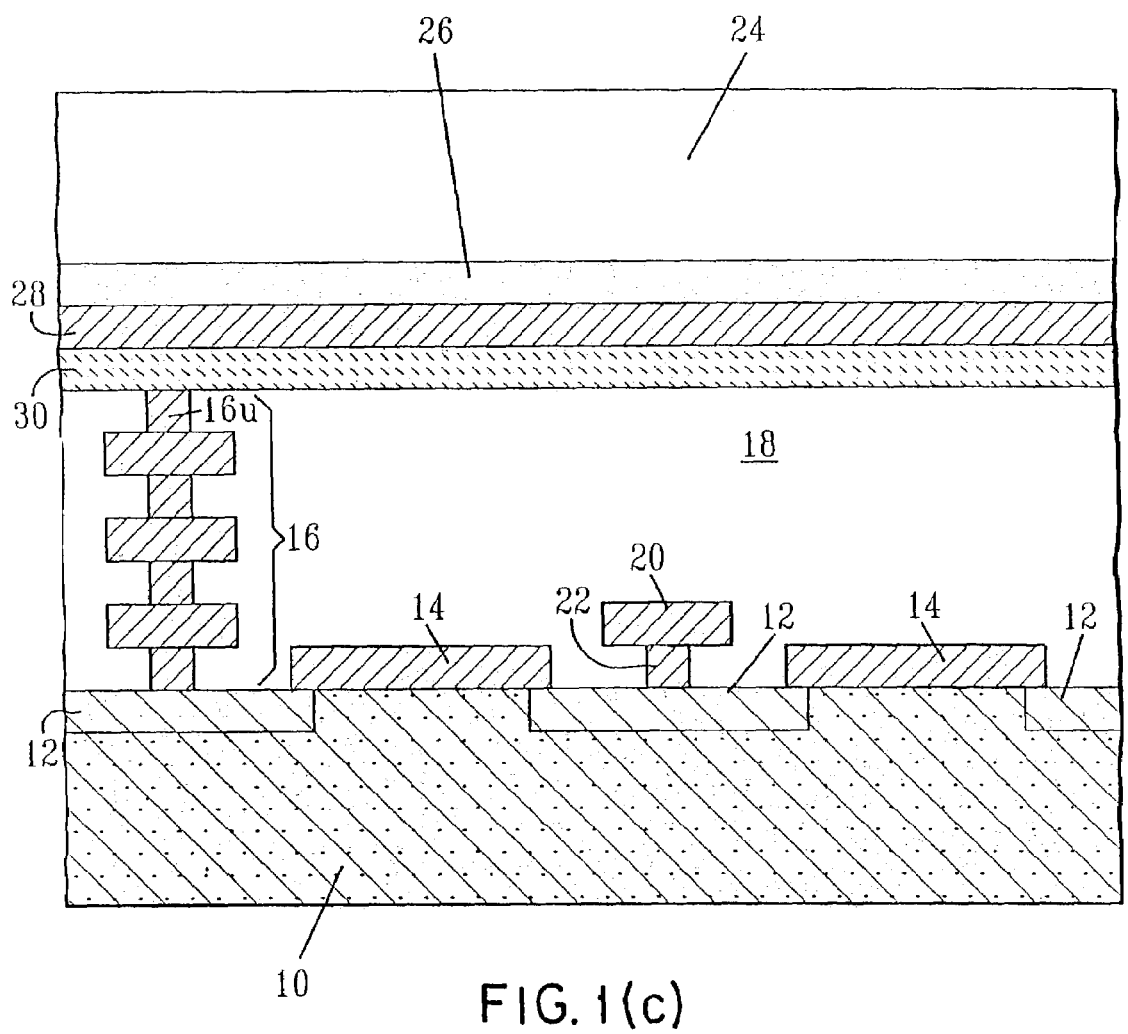

The intermediate structure of FIG. 1(c) is then bonded at a temperature of less than about 600° C. so that bonding occurs between ferroelectric film 30 and the top dielectric layer of the CMOS structure as well as patterned conductive electrode layer 16u. Specifically, the annealing step is carried out in a substantially inert gas atmosphere, e.g. vacuum, He, Ar, $N_2$, or mixtures thereof that can be optionally mixed with an oxidizing gas such as $O_2$, steam, $O_3$, $N_2O$ or $H_2O_2$. Highly preferred annealing temperatures that can be employed in the present invention are from about room temperature, i.e. 25EC, to about 600EC, with from about 100° to about 400° C. being more highly preferred. Typically, annealing is carried out for a time period of from about 1 minute to about 6 hours, with from about 2 minutes to about 3 hours being more highly preferred. The annealing step may be carried out using a single ramp cycle or multiple ramp and soak cycles can also be used.

Bonding may be additionally facilitated using external pressure to push the bonding interfaces together, and/or by using the surface tension of a thin, removable liquid layer placed at the bonding interface. The thin liquid layer would typically be water, and could be removed by evaporation. Bonding may also be facilitated with the use of electric fields in processes known to the prior art as anodic bonding.

Figure 1D:
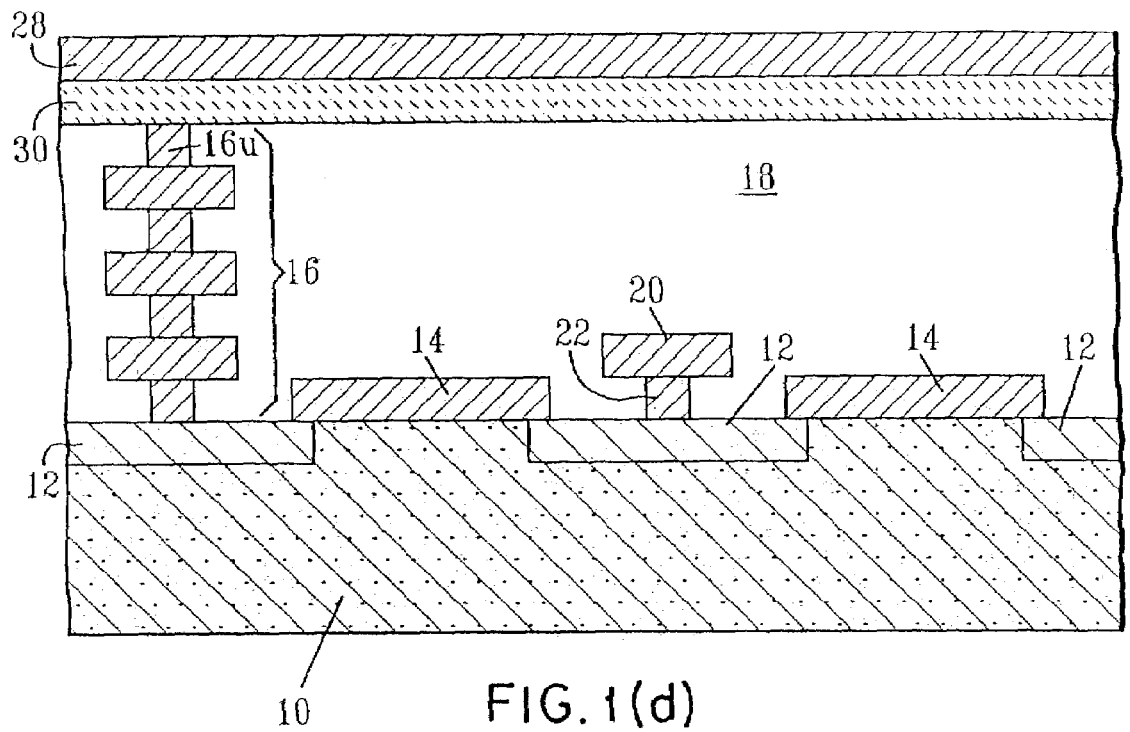

After bonding ferroelectric film 30 to the CMOS structure, sacrificial release layer 26 and carrier substrate 24 are removed from the structure, See FIG. 1(d). The preferred method for removing the carrier substrate depends on the type of sacrificial release layer selected. One means of removing the carrier wafer is by a selective etch process.

It is noted that in this figure, the ferroelectric film is bonded to the CMOS dielectric and the upper conductive electrode layer. In accordance with the present invention, the upper conductive electrode layer 16u of the CMOS structure becomes the bottom electrode of the storage capacitor. On top of the ferroelectric film is the upper electrode 28 of the capacitor. As further shown in FIG. 1(d), the capacitor, i.e. upper conductive electrode layer (bottom electrode) 16u, ferroelectric film 30 and conductive layer (upper electrode) 28, is formed over the CMOS structure. In cases wherein the conductive electrode layer 16u of the CMOS is not patterned in FIGS. 2(a), 2(c) and 2(g), ferroelectric film 30 would be directly bonded to the unpatterned conductive layer. In cases where the optional conductive layer is present on the FE delivery wafer, the optional conductive layer would be bonded to the CMOS wafer.

Figure 1E:
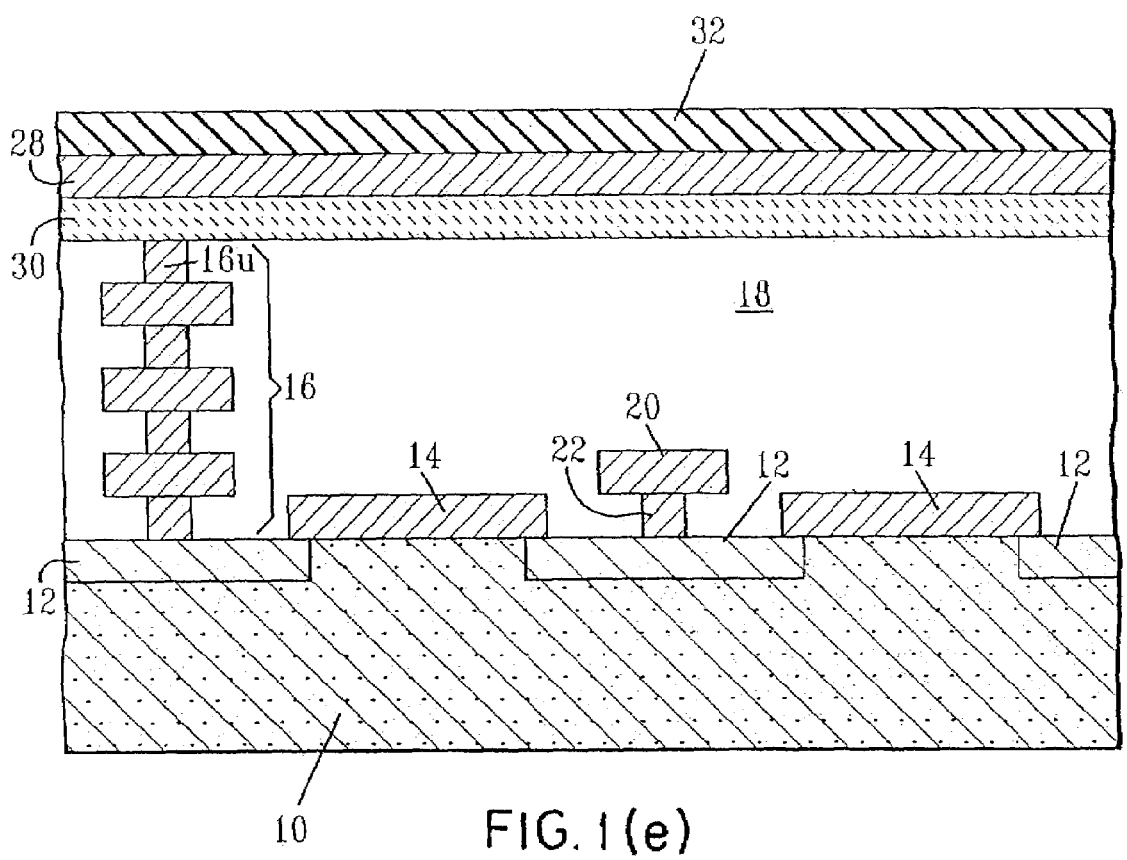

After removing at least most of the carrier substrate 24 and the sacrificial release film 26, the resulting integrated CMOS/FE structure may be optionally polished. Additional electrode and/or ferroelectric patterning steps may then be performed as required for electrical isolation of individual capacitor elements. A passivating material 32, as shown in FIG. 1(e), may then be optionally formed on the surface of conductive layer 28. Suitable passivating materials include: $Al_{23}$, $TiO_2$, $Ta_2O_5$, $Si_3N_4$ and $SiO_2$. The passivating material layer is formed using conventional deposition processes well known to those skilled in the art including, but not limited to: CVD, dip coating and spin-on coating. The thickness thereof is sufficient to prevent diffusion of air or moisture into the underlying layers of the integrated FE/CMOS structure.

While the present invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new and desire to secure by the Letters Patent is:

1. A FE delivery wafer comprising a carrier substrate, a sacrificial release layer located on a surface of said carrier substrate, a conductive layer located on a surface of said sacrificial release layer, and a ferroelectric layer located on a surface of said conductive layer, wherein said sacrificial release layer is provided by implanting said delivery wafer with a desorbable species prior to or after deposition and said ferroelectric layer is on an outermost surface of said FE delivery wafer.

2. The FE delivery wafer of claim 1 wherein said desorbable species is hydrogen.

* * * * *